US007208858B2

(12) United States Patent
Manchester et al.

(10) Patent No.: US 7,208,858 B2
(45) Date of Patent: Apr. 24, 2007

(54) ULTRASONIC CLEANING TANK

(75) Inventors: Russell Manchester, Waconia, MN (US); Wayne Mouser, Maple Grove, MN (US)

(73) Assignee: Forward Technology A Crest Group Company, Minneapolis, MN (US)

( * ) Notice: Subject to any disclaimer, the term of this patent is extended or adjusted under 35 U.S.C. 154(b) by 0 days.

(21) Appl. No.: 11/333,736

(22) Filed: Jan. 17, 2006

(65) Prior Publication Data

US 2006/0113873 A1 Jun. 1, 2006

Related U.S. Application Data

(62) Division of application No. 10/772,093, filed on Feb. 4, 2004, now Pat. No. 7,019,440.

(60) Provisional application No. 60/444,752, filed on Feb. 4, 2003.

(51) Int. Cl.
*B08B 3/00* (2006.01)
*H01L 41/04* (2006.01)

(52) U.S. Cl. .......................... 310/311; 134/1; 134/1.3; 134/10

(58) Field of Classification Search .................... 134/1, 134/1.3, 10, 34; 433/119, 86
See application file for complete search history.

(56) References Cited

U.S. PATENT DOCUMENTS

| | | | |
|---|---|---|---|
| 3,809,050 A | | 5/1974 | Chough |
| 3,868,272 A | | 2/1975 | Tardoskegyi |
| 4,003,798 A | | 1/1977 | McCord |
| 4,370,992 A | | 2/1983 | Choudhury et al. |
| 5,247,954 A | * | 9/1993 | Grant et al. .................. 134/1 |
| 6,016,821 A | * | 1/2000 | Puskas ...................... 134/186 |
| 6,150,753 A | | 11/2000 | DeCastro |
| 6,181,052 B1 | | 1/2001 | Puskas |
| 6,231,684 B1 | | 5/2001 | Mouser |
| 6,432,212 B1 | | 8/2002 | Hirose et al. |
| 6,481,449 B1 | | 11/2002 | Manchester |

FOREIGN PATENT DOCUMENTS

| | | | |
|---|---|---|---|
| JP | 04042530 A | * | 2/1992 |
| JP | 06182304 A | * | 7/1994 |

* cited by examiner

*Primary Examiner*—Darren Schuberg
*Assistant Examiner*—J. Aguirrechea
(74) *Attorney, Agent, or Firm*—Patterson, Thuente, Skaar & Christensen, P.A.

(57) ABSTRACT

An ultrasonic cleaning tank for use in cleaning electronic parts having a top portion and a bottom portion operably divided by a perforated dispersion plate. The cleaning tank is assembled to avoid internal projections or obstructions within the top portion to create a piston-like, laminar flow region. The dispersion plate is constructed to provide a backpressure within the bottom portion so as to promote even flow of a cleaning fluid through the perforations. The cleaning fluid flows upward past an electronic part. At the same time, an ultrasonic transducer supplies ultrasonic energy within the cleaning fluid creating cavitation such that any particulate matter is scrubbed from the electronic parts. The particulates are subsequently carried upward by the laminar flow and over a tank lip. The cleaning tank can be used in either a batch or recirculating mode.

20 Claims, 7 Drawing Sheets

ULTRASONIC CLEANING TANK

RELATED APPLICATION

This application is a divisional application of U.S. patent application Ser. No. 10/772,093 filed Feb. 4, 2004 now U.S. Pat. No. 7,019,440, and entitled "ULTRASONIC CLEANING TANK", which claims the benefit of U.S. Provisional Application Ser. No. 60/444,752 filed Feb. 4, 2003, and entitled "ULTRASONIC CLEANING TANK", both of which are herein incorporated by reference in their entirety.

FIELD OF THE INVENTION

The present invention relates generally to an ultrasonic system for precision cleaning of parts. In particular, the invention relates to an ultrasonic cleaning system that includes a cleaning tank with an internal dispersion plate adapted to promote upward laminar flow within the cleaning tank for improved part cleaning.

BACKGROUND OF THE INVENTION

Precision cleaning and drying systems typically utilize a wide variety of cleaning solutions including various solvents, detergents, or other aqueous mixtures. These systems operate to clean and dry various devices or parts such as medical devices, optical instruments, wafers, PC boards, hybrid circuits, disk drive components, precision mechanical or electromechanical components, or the like. In the precision cleaning industry in particular, there exists a need for an efficient cleaning system generally having a high tank turnover rate.

Ultrasonic systems for processing and cleaning parts within a tank are generally known. In a typical prior art ultrasonic system, the tank contains a cleaning solution and the parts to be cleaned are introduced therein. Ultrasonic energy is applied to the tank, and the ultrasonic vibrations generate pressure gradients within the cleaning solution, forming minute cavitation bubbles. These cavitations implode against a surface of the part to be cleaned releasing tremendous energy thereby dislodging contaminants.

In prior art systems, the ultrasonic energy is turned off while the solution within the tank is refreshed. For example, new or filtered solution is pumped into bottom of the tank, while the solution within the tank containing the contaminants overflows one or more sides out of the tank, to be filtered and reused or discarded. It is necessary to apply ultrasonic energy separately from refreshing the tank in these systems because the turbulence associated with a high rate of tank refreshing flow disrupts the ultrasonic wave pattern that produces the ultrasonic cavitations. In prior art ultrasonic systems, mixing of contaminants within the tank with the refreshed solution still occurs such that the contaminants are eliminated slowly in a logarithmic manner over time. Logarithmic elimination of all contaminants theoretically takes an infinite amount of time, greatly reducing the overall turnover clean up rate.

One prior art ultrasonic system, described in U.S. Pat. No. 6,181,052, attempted to create laminar flow within the tank by including at least two baffles at the bottom of the tank. The purpose of the baffles was to reduce the velocity of the incoming cleaning solution, equalize the pressure of the clean solution, and introduce the solution in the bottom of the tank with equal spatial distribution. However, these baffles as described have two serious shortcomings to achieve the desired results. First the upper baffle was welded into place within the tank, or mounted within the tank such that the mounting bracket interferes with uniform flow up along the sidewalls of the tank, which introduces a countercurrent within the tank causing turbulent mixing which again slows down the elimination of contaminants from the tank and the overall turnover rate. Secondly, the large open area of this baffle plate, a minimum of 45% open, prevents uniform upward flow from developing by failing to develop uniform pressure behind the second baffle.

SUMMARY OF THE INVENTION

An object of the present invention is to create laminar flow characteristics within an ultrasonic cleaning tank by providing a diffusion plate having a predetermined number of perforations of a calculated size. This method allows for uniform flow without interference at the sidewalls and provides a high turnover at a given flow rate to achieve efficient cleaning. By providing an external flange-mounted diffusion plate that is removable, an appropriate diffusion plate can be provided to accommodate different flow and turnover rate requirements of the ultrasonic cleaning system. The external flange design allows the construction of a cleaning tank with no obstructions to induce turbulence within the cleaning fluid. Further, the external flange design provides a simple means for removing the plate to make modifications if required.

DETAILED DESCRIPTION OF THE INVENTION

Figure 1:
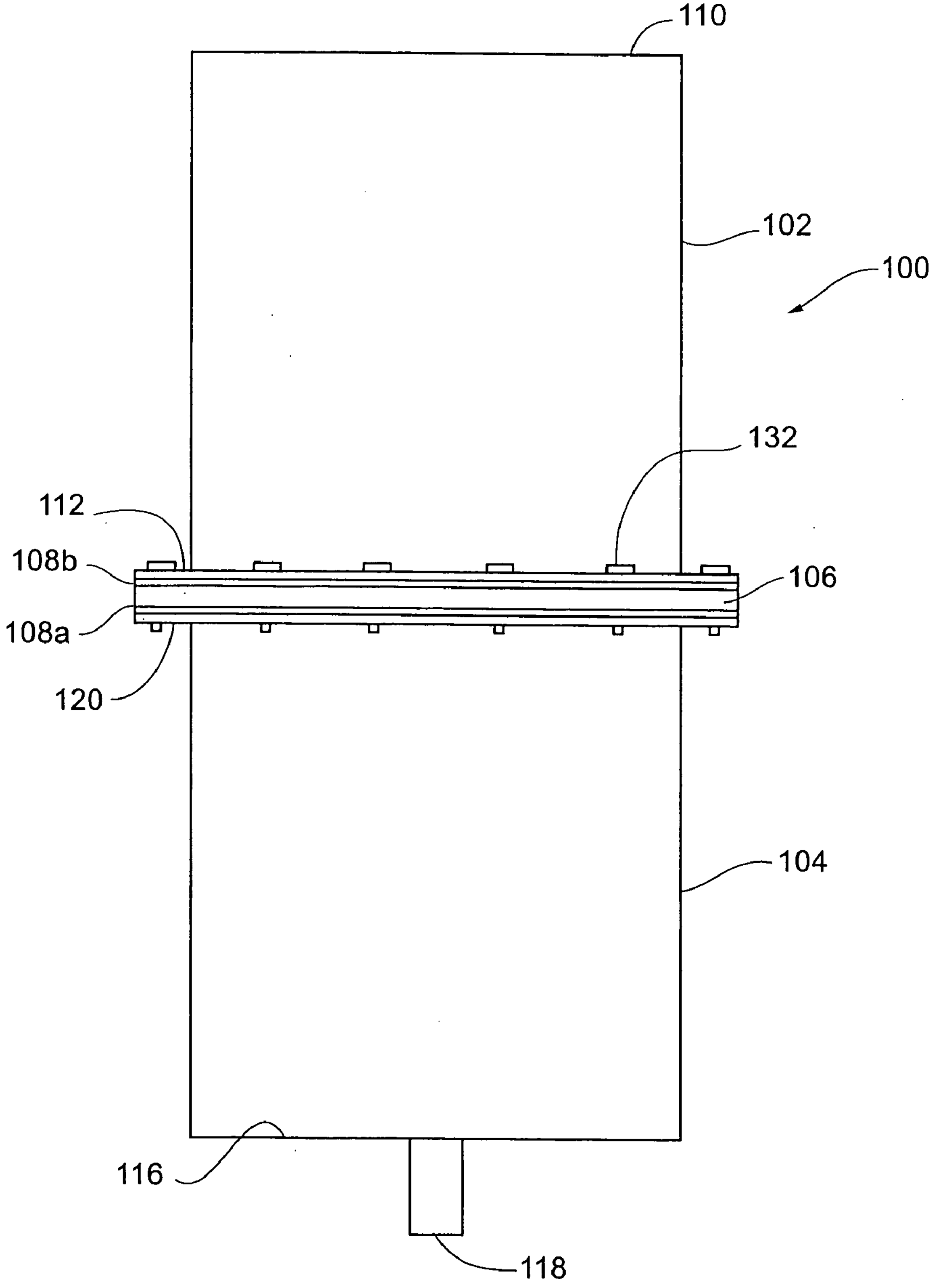
FIG. 1 is a side view of a cleaning tank of the present invention.
Figure 2:
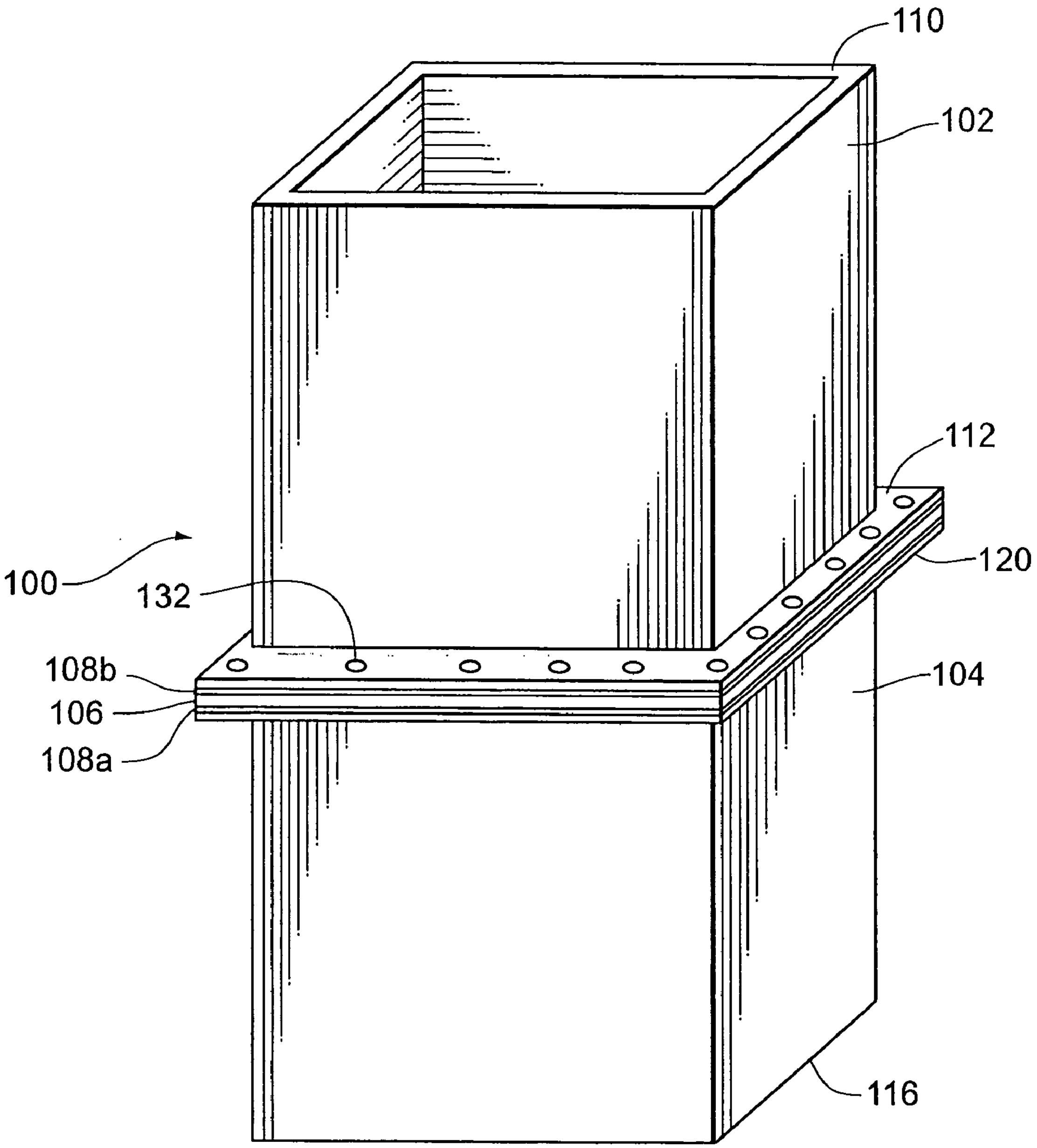
FIG. 2 is a perspective view of the cleaning tank of FIG. 1.

FIGS. 1 and 2 illustrate a cleaning tank 100 of the present invention. Cleaning tank 100 typically has a welded construction using stainless steel. Alternatively, cleaning tank 100 can be constructed of other materials when the use of stainless steel is not recommended. Alternative materials could include tantalum, titanium, quarts or plastics such as PEEK. As depicted, cleaning tank 100 has a rectangular cross-section though other geometrical configurations, such as cylindrical can be used without departing from the scope of the present invention.

Figure 3:
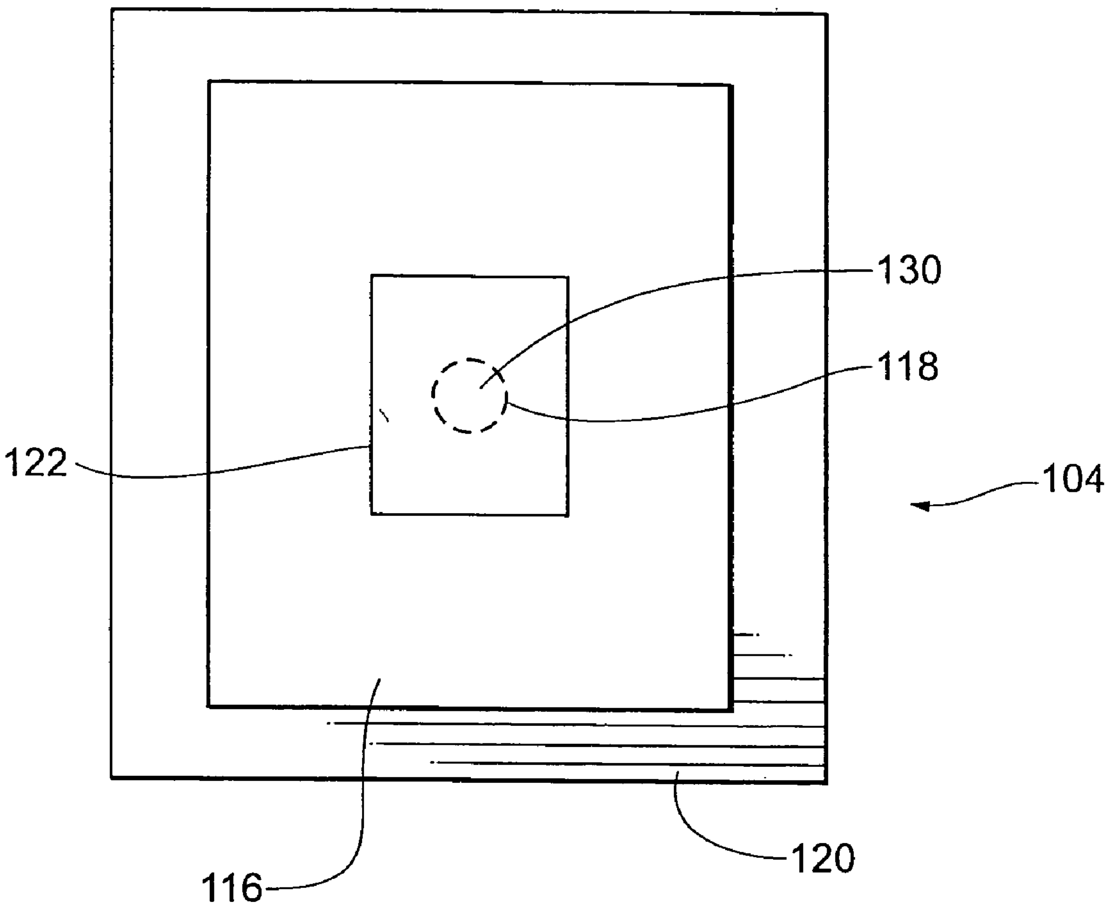
FIG. 3 is a top view of a lower tank assembly.

As shown in FIGS. 1 and 2, Cleaning tank 100 comprises an upper tank assembly 102, a lower tank assembly 104, a dispersion plate 106 and a pair of flange gaskets 108*a*, 108*b*. Flange gaskets 108*a*, 108*b* are comprised of a suitable gasket material that is both chemically inert and non-leaching. For example, flange gaskets 108*a*, 108*b* can comprise polymers such as TEFLON®, PVDF, EPDM, VITON® or perflourinated elastomers. Upper tank assembly 102 includes a top lip 110 and an upper perimeter flange member 112. Lower tank assembly 104 includes a floor 116, an inlet port 118 and a bottom perimeter flange member 120. Floor 116 as shown in FIG. 3 can further include an inlet plate 122 mounted above the inlet port 118. Upper perimeter flange member 112 and bottom perimeter flange member 120 are substantially identically shaped and sized.

Figure 4:
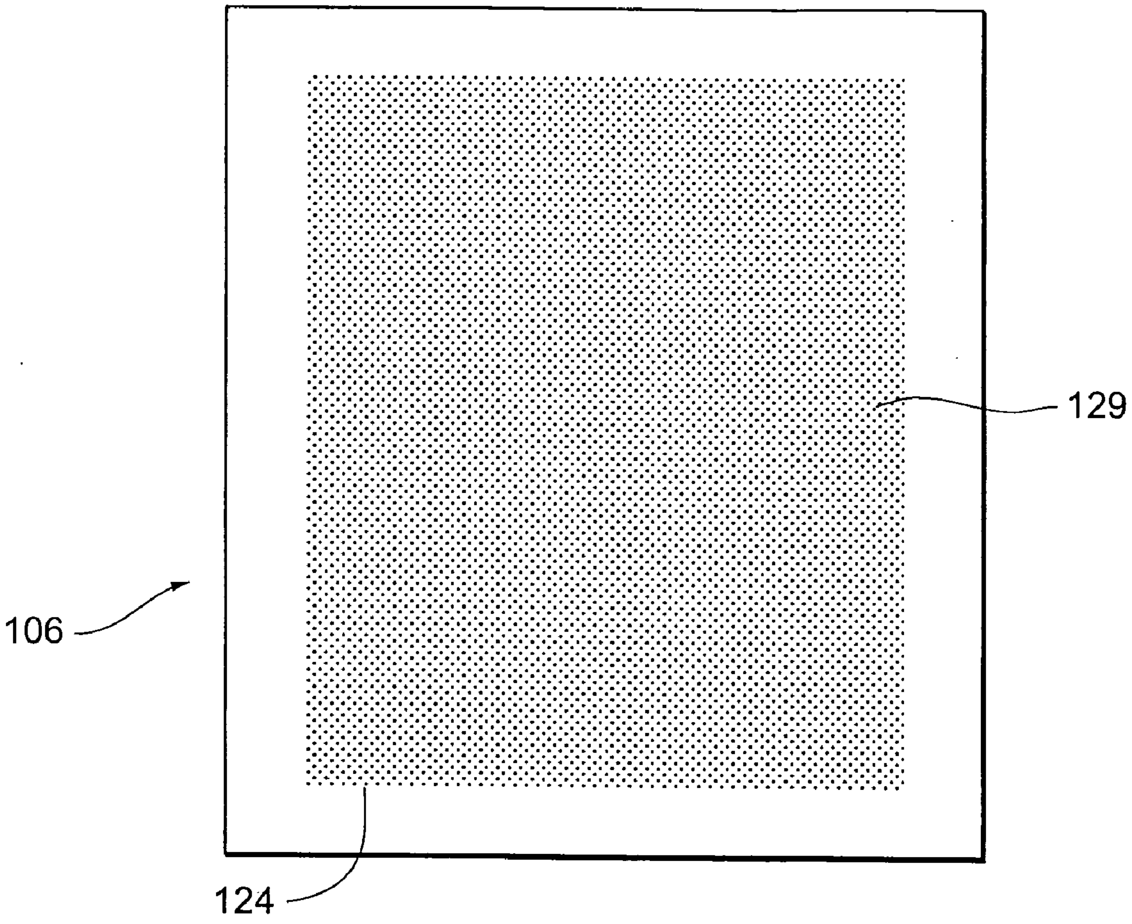
FIG. 4 is a top view of a dispersion plate.
Figure 5:
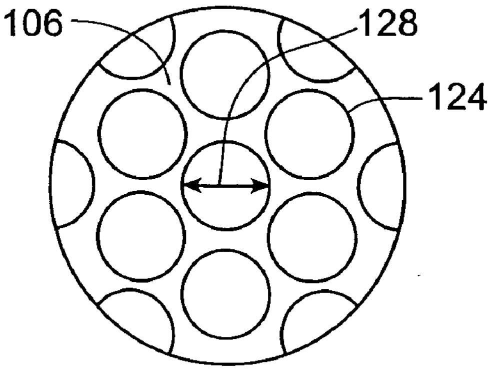
FIG. 5 is a top view of a plurality of perforations on the dispersion plate of FIG. 4.
Figure 4A:
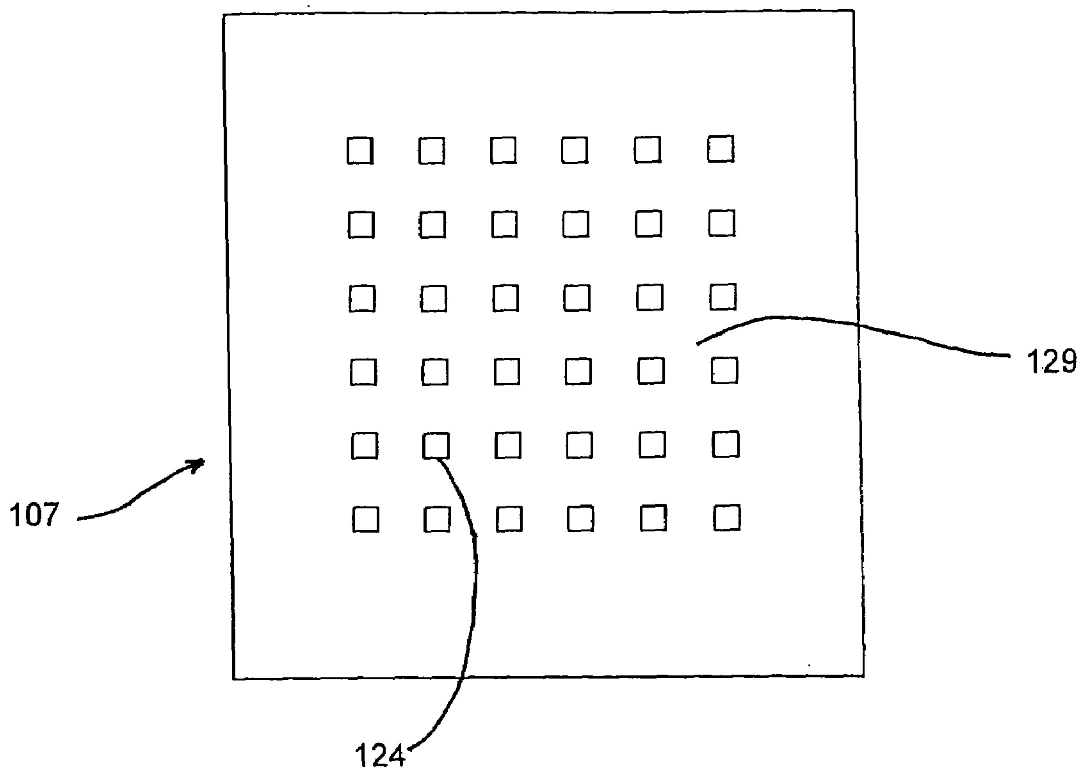
FIG. 4A is a top view of an alternative embodiment of a dispersion plate.
Figure 5A:
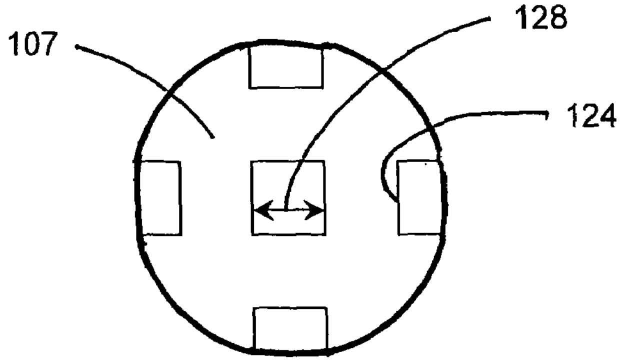
FIG. 5A is a top view of a plurality of perforations on the dispersion plate of FIG. 4A.

Preferably, dispersion plate 106 comprises the same material of construction as cleaning tank 100, for example stainless steel. Dispersion plate 106 is constructed so as have essentially the same size and shape as defined by the upper perimeter flange member 112 and the bottom perimeter flange member 120. As illustrated in FIG. 4, dispersion plate 106 includes a plurality of spaced apart perforations 124. Perforations 124 are preferably uniform and can be formed by processes including laser cutting, mechanical punching, drilling or other suitable mechanical operations. In a preferred embodiment, perforations 124 are arranged in a close hex pattern 126 on the dispersion plate 106 as shown in FIG. 5. Perforations 124 are preferably circular but can be can be fabricated in other geometric configurations, for example squares, circles, ovals, rectangles or other suitable shapes. Perforations 124 are configured to have a perforation diameter 128 as small as possible for the specific cleaning application, for example, between 0.001 inches to 0.250 inches. When manufactured, a total perforation area 129 representing the sum of all the perforations 124 represents an amount slightly less than, equal to or greater than an inlet area 130 of the inlet port 118. In all embodiments, the total perforation area 129 represents less than 45% percent of the total area of the dispersion plate 106.

In assembling the cleaning tank 100, the dispersion plate 106 is placed over the bottom perimeter flange member 120 such that flange gasket **108*a* resides between them. Flange gasket 108*b* is placed on top of the dispersion plate 106. Finally, upper tank assembly 102 is positioned such that the upper perimeter flange member 112 resides on top of the flange gasket 108*b*. The lower tank assembly 102 and upper tank assembly 104 can then be operably coupled with a plurality of fasteners 132, for example nuts and bolts that project through aligned bores in the bottom perimeter flange member 120, the dispersion plate 106 and upper perimeter flange member 112. Fasteners 132 can be exterior to or pass through the flange gaskets 108*a*, 108*b*. In an alternative embodiment, fasteners 132 can take the form of external clamps, for example c-clamps. By assembling the cleaning tank 100 in such a manner, it is possible to removably exchange alternative configurations of the dispersion plate 106, i.e., a second dispersion plate 107 having differing perforation 124 geometries, sizes and/or quantities. By varying the perforations 124, dispersion plate 106 and second dispersion plate 107** can be tailored for specific cleaning rates, part geometries and/or part loading arrangements.

Figure 6:
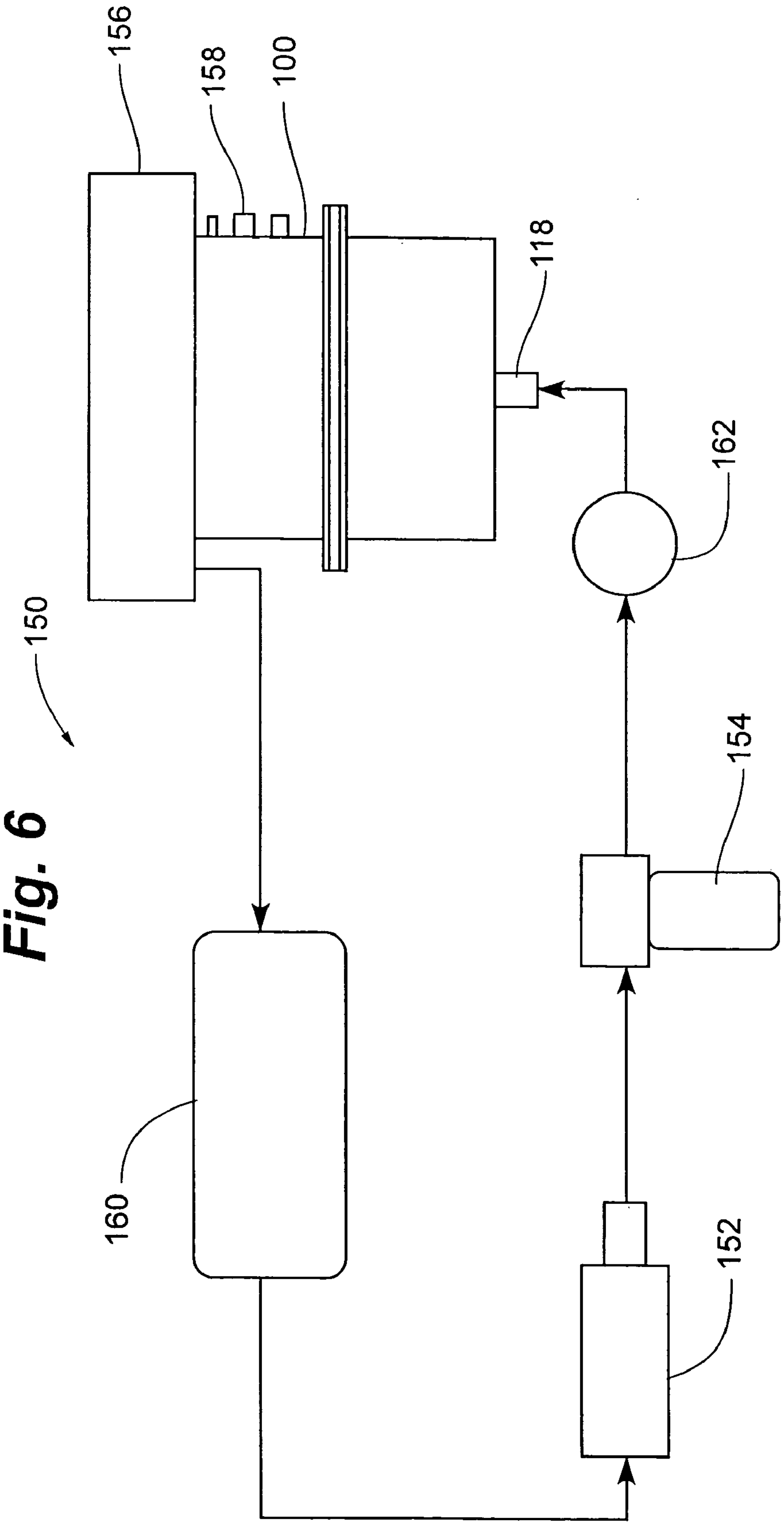
FIG. 6 is a flow diagram of an embodiment of a recirculating ultrasonic cleaning system of the present invention.
Figure 7:
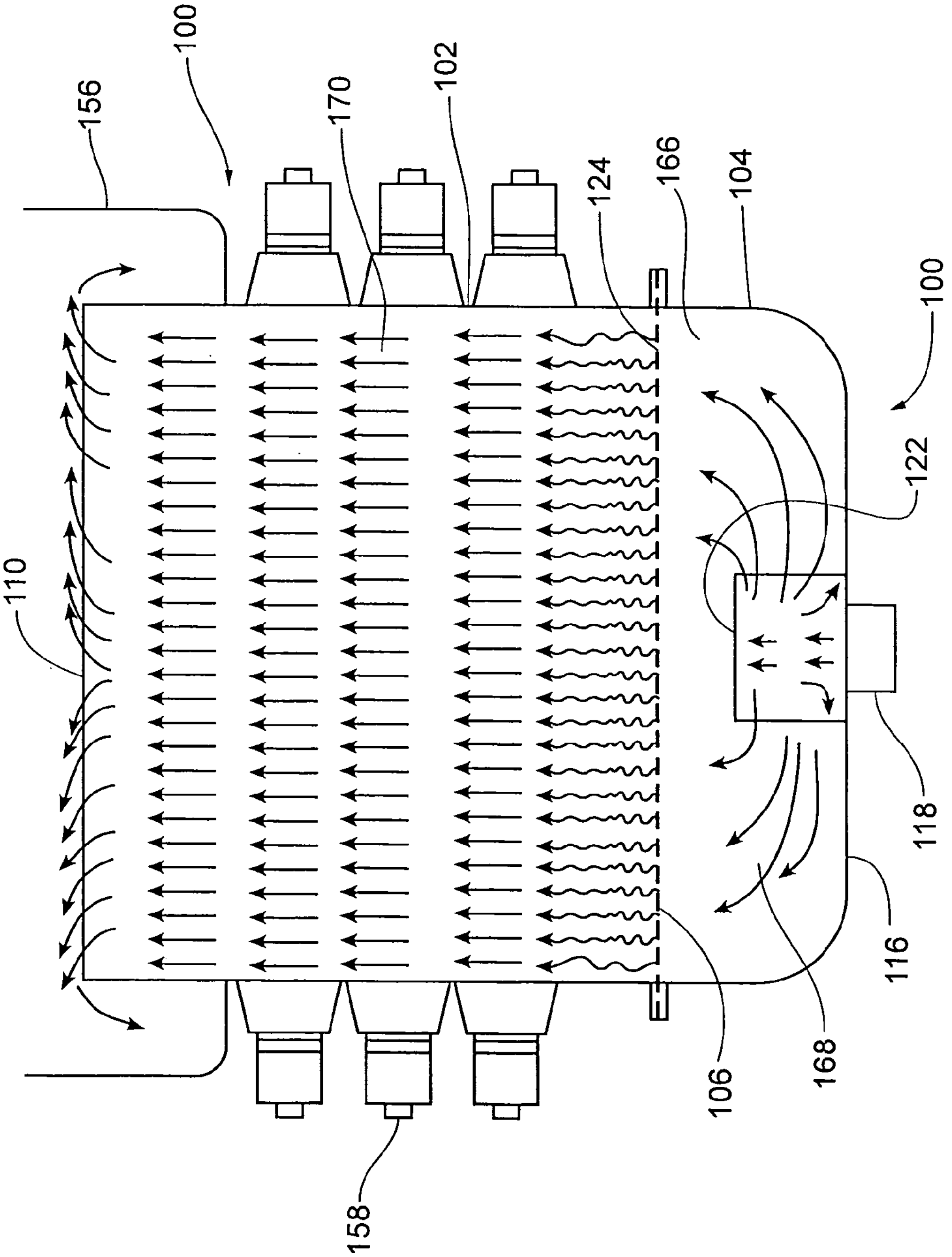
FIG. 7 is a flow diagram of the cleaning tank used in the recirculating ultrasonic cleaning system of FIG. 6.

Cleaning tank 100 can be used as part of a single-pass or recirculating ultrasonic cleaning system. A recirculating ultrasonic cleaning system 150 is shown schematically in FIG. 6. Generally, the recirculating ultrasonic cleaning system 150 comprises the cleaning tank 100, a pump 152, an in-line filter 154 and a weir assembly 156. In a preferred embodiment, pump 152 has a pumping capacity providing for at least one tank volume per minute or more. Pump 152 preferably has an adjustable pump speed for varying flow rates based upon a variety of cleaning variables. In-line filter 154 comprises a commercially available in-line filter including a filter media, for example polyether sulfone, TEFLON®, PVDF, polyester, or polypropylene, capable of removing particulates down to 0.03 microns in size. As shown in FIG. 7, cleaning tank 100 includes a plurality of exterior bonded, ultrasonic transducers 158. In a preferred embodiment, ultrasonic transducer 158 is a Crest Ultrasonic Corp. ceramic enhanced transducer supplying ultrasonic energy at a suitable frequency of between 28 KHz and 2.5 MHz. Ultrasonic transducers 158 are bonded directly to the exterior of the upper tank assembly 102 with an adhesive such as epoxy. Recirculating ultrasonic cleaning system 150 can further comprise an inline heat exchanger 160. In addition, recirculating ultrasonic cleaning system 150 can include a degasification unit 162 for removing dissolved gases, which can have adverse effects on the delivery of ultrasonic energy. While not depicted, it will be understood that recirculating ultrasonic cleaning system 150 can include suitable valve and or sensors for use during operation and draining.

To use recirculating ultrasonic cleaning system 150, a electronic, medical or optical part is placed within the cleaning tank 100, typically using a basket, a rack or a cleaning fixture, adapted for insertion into the cleaning tank 100. Prior to placing the loaded within the cleaning tank 100, the cleaning tank 100 is filled with a cleaning solution 166. Cleaning solution 166 can be suitable aqueous, semi-aqueous or solvent based solutions comprising any combination of deionized water, detergents, or any number of suitable organic solvents alone or in mixtures. When cleaning solution 166 is an aqueous or semi-aqueous solution, inline heat exchanger 160 selectively heats or cools to maintains the temperature of the cleaning solution 166 in the recirculating loop between ambient and two hundred degrees F.

Once cleaning tank 100 is filled with the cleaning solution 166 and the loaded basket, a process logic controller (PLC) can be used to start the pump 152 to recirculate the cleaning solution 166 through the in-line filter 154 and into the cleaning tank 100 through the inlet port 118. The flow within the cleaning tank 100 is shown in FIG. 7. At inlet port 118, incoming cleaning solution 166 is distributed to the sides of cleaning tank 100 with inlet plate 122. The combination of inlet plate 122 and the backpressure applied by dispersion plate 106 results in a turbulent flow pattern 168 within the lower tank assembly 104. The backpressure applied by dispersion plate 106 causes the cleaning solution 166 to distribute and flow upward evenly through the perforations 124 and into the upper tank assembly 102. The even flow of the cleaning solution 166 through the perforation 124 results in a substantially parallel, laminar flow pattern 170 within the upper tank assembly 102. The laminar flow pattern 170 is maintained as cleaning solution 166 approaches the top lip 110 as there are no internal projections or obstructions along the sides of upper tank assembly 102 to disrupt the substantially parallel, upward flow of the cleaning solution 166.

As the cleaning solution 166 flows upward through the upper tank assembly 102, the ultrasonic transducer 158 supplies ultrasonic energy within the cleaning solution 166. The ultrasonic energy causes alternating patterns of low and high pressure phases within the cleaning solution 166. In the low pressure phase, bubbles or vacuum cavities are formed. In the high pressure phase, the bubbles implode violently. This process of creating and imploding bubbles is commonly referred to as cavitation. Cavitation results in an intense scrubbing process along the surface of the parts causing any particulate to be removed from the parts. The bubbles created during cavitation are minute and as such are able to penetrate microscopic crevices to provide enhanced cleaning as compared to simple immersion or agitation cleaning processes.

When particulates are removed from the part, the laminar flow pattern 170 carries the particulate upward and over the top lip 110. Once cleaning solution 166 overflows the upper tank assembly 102, the cleaning solution 166 and any removed particulate flows into the overflow weir 156. Overflow weir includes a drain whereby the cleaning solution 166 and any particulates are returned to an inlet side of the pump 152. Pump 152 circulates the cleaning solution 166 and particulates through the in-line filter 154 whereby the particulate is retained and the cleaning solution 166 is again directed into the cleaning tank 100 through the inlet port 118.

In a preferred embodiment, the recirculating ultrasonic cleaning system 150 is fully contained within a cabinet to present a pleasing, aesthetic appearance. In such a cabinetized system, a user need only supply the cleaning solution 166, a dispersion plate 106 including the desired perforation configuration, the parts and an electrical power source to power the recirculating ultrasonic cleaning system 150.

It is understood that this invention is not intended to be unduly limited by the illustrative embodiments and examples set forth herein and that such examples and embodiments are presented by way of example only.

What is claimed is:

1. An ultrasonic cleaning tank for precision cleaning of electronic components, the cleaning tank comprising:

a top portion having a lower flanged perimeter edge;

a bottom portion having an upper flanged perimeter edge and having a floor that incorporates an inlet port; and a dispersion plate having a plurality of perforations, wherein the dispersion plate is sealingly and removably mounted between the lower flanged perimeter edge and the upper flanged perimeter edge, and wherein upon introducing a cleaning fluid to said inlet port a turbulent flow is created within said bottom portion and a laminar flow is created within said top portion after said cleaning fluid passes through said plurality of perforations of said dispersion plate.

2. The ultrasonic cleaning tank of claim 1 wherein the dispersion plate is sealingly and removably mounted between the lower flanged perimeter edge and the upper flanged perimeter edge using a plurality of fasteners, an upper gasket and a lower gasket.

3. The ultrasonic cleaning tank of claim 2 wherein the plurality of fasteners comprise a plurality of external clamps.

4. The ultrasonic cleaning tank of claim 2 wherein the upper gasket and the lower gasket comprise a gasket material selected from the group consisting essentially of: TEFLON®, PVDF, EPDM, VITON® and a perflourinated elastomer.

5. The ultrasonic cleaning tank of claim 1 wherein a sum of the plurality of perforations defines a total perforation area and wherein the total perforation area is less than 45% of the dispersion plate.

6. The ultrasonic cleaning tank of claim 5 wherein the total perforation area is slightly less than or slightly greater than an inlet area of the inlet port.

7. The ultrasonic cleaning tank of claim 1 wherein each of the plurality of perforations has a perforation diameter within the range of 0.001–0.250 inches.

8. The ultrasonic cleaning tank of claim 1 wherein the plurality of perforations is configured in a close hex arrangement on the dispersion plate.

9. The ultrasonic cleaning tank of claim 1 wherein the top portion and the bottom portion comprise stainless steel.

10. The ultrasonic cleaning tank of claim 1 wherein the floor includes an inlet plate for directing an inlet flow outwardly and evenly throughout the bottom portion.

11. The ultrasonic cleaning tank of claim 1 wherein an ultrasonic transducer is operably mounted to the upper portion, the ultrasonic transducer selected to supply ultrasonic energy within the upper tank portion at a suitable ultrasonic frequency of between 28 KHz and 2.5 MHz.

12. A cleaning assembly comprising:

a disassemblable tank having a top portion and a bottom portion;

a replaceable, perforated dispersion plate; and means for joining the top portion, the bottom portion and the replaceable, perforated dispersion plate in sealed relation such that an upward fluid flow from the bottom portion to the top portion has a turbulent flow within the bottom portion and a laminar flow within the top portion.

13. The cleaning assembly of claim 12, wherein the means for joining comprises a bottom flange on the bottom portion and a top flange on the top portion and at least one fastener.

14. The cleaning assembly of claim 13, wherein the means for joining further comprises a bottom gasket and a top gasket.

15. A cleaning tank assembly for cleaning electronic components comprising:

a tank having a upper tank assembly and a lower tank assembly; and a removeable dispersion plate having a plurality of perforations, the removeable dispersion plate sealingly mounted between the upper tank assembly and the lower tank assembly such that an upward cleaning fluid flow introduced through an inlet port in the lower tank assembly has a turbulent flow pattern within the lower tank assembly and a laminar flow pattern within the upper tank assembly.

16. The cleaning tank assembly of claim 15, wherein the upper tank assembly is absent any internal projections so as to avoid any disturbance of the laminar flow pattern within the upper tank assembly.

17. The cleaning tank assembly of claim 15, wherein the upper tank assembly comprises at least one ultrasonic transducer for supplying ultrasonic energy within the upper tank assembly.

18. The cleaning tank assembly of claim 15, wherein the upper tank assembly comprises an overflow weir for receiving the upward cleaning fluid flow.

19. The cleaning tank assembly of claim 15, wherein the lower tank assembly comprises an inlet flow plate proximate the inlet port for distributing the upward cleaning fluid flow throughout the lower tank assembly.

20. The cleaning tank assembly of claim 15, wherein the tank has a rectangular cross-section.

* * * * *